United States Patent
Russo et al.

(10) Patent No.: US 12,224,016 B2
(45) Date of Patent: Feb. 11, 2025

(54) TRANSIENT AND STABLE STATE READ OPERATIONS OF A MEMORY DEVICE

(71) Applicant: Micron Technology, Inc., Boise, ID (US)

(72) Inventors: Ugo Russo, Boise, ID (US); Karan Banerjee, Singapore (SG); Shyam Sunder Raghunathan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 214 days.

(21) Appl. No.: 17/888,781

(22) Filed: Aug. 16, 2022

(65) Prior Publication Data
US 2024/0062829 A1 Feb. 22, 2024

(51) Int. Cl.
*G11C 16/26* (2006.01)
(52) U.S. Cl.
CPC .................................. *G11C 16/26* (2013.01)
(58) Field of Classification Search
CPC ...... G11C 16/26; G11C 16/0483; G11C 16/32
See application file for complete search history.

(56) References Cited

U.S. PATENT DOCUMENTS

| | | | |
|---|---|---|---|
| 2016/0247578 A1* | 8/2016 | Yun | G11C 16/3418 |
| 2019/0035466 A1* | 1/2019 | Kim | G11C 16/0483 |
| 2021/0109807 A1* | 4/2021 | Papandreou | G06F 11/1048 |
| 2022/0130467 A1* | 4/2022 | Yu | G11C 16/26 |
| 2024/0028220 A1* | 1/2024 | Kim | G11C 16/26 |

* cited by examiner

Primary Examiner — Jerome Leboeuf
(74) Attorney, Agent, or Firm — Holland & Hart LLP

(57) ABSTRACT

A memory system may implement a read operation including a delay if a channel is at stable state, and may implement a read operation without a delay if the channel is in a transient state. Upon receiving a read command to a set of memory cells sharing the channel, the memory system may determine whether the channel is in a stable or transient state. If the channel is in a stable state, the memory system may perform a read operation including a delay between boosting the channel and driving respective word lines, such that the channel partially discharges prior to driving the word lines. If the channel is in a transient state, the memory system may perform a read operation without a delay between boosting the channel and driving the word lines.

25 Claims, 6 Drawing Sheets

First Dielectric Material

Storage Element

Second Dielectric Material

TRANSIENT AND STABLE STATE READ OPERATIONS OF A MEMORY DEVICE

FIELD OF TECHNOLOGY

The following relates to one or more systems for memory, including transient and stable state read operations of a memory device.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
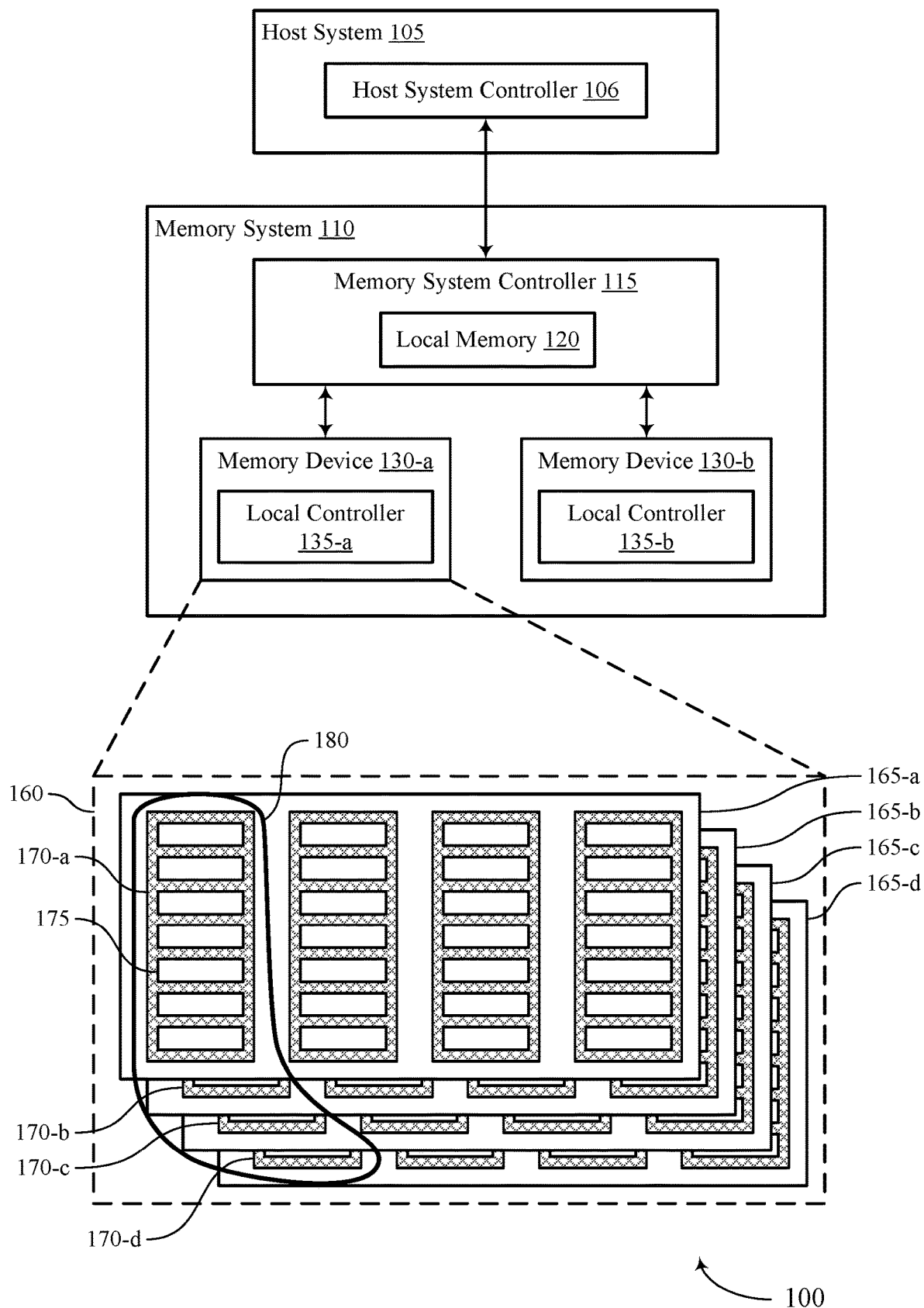
FIG. 1 illustrates an example of a system that supports transient and stable state read operations of a memory device in accordance with examples as disclosed herein.

A memory system may include a set of memory cells (e.g., non-volatile memory cells, not-and (NAND) memory cells) that share a channel. In some examples, the memory system may perform a read operation on a memory cell of the set of memory cells by driving one or more word lines of other cells of the set to a voltage level (e.g., a pass voltage level). Driving the word lines to the voltage level may boost the voltage of the channel. The read operation may result in a residual charge (e.g., a negative potential) at the channel, which may discharge (e.g., to a stable state value, to a ground reference) over a duration following the read operation. Subsequent read operations may boost (e.g., re-boost) the voltage of the channel from the stable state value to a respective voltage level that is based on a duration since a previous read operation to the set of memory cells.

In some examples, performing an access operation with the voltage of the channel boosted from the stable state may adversely affect the set of memory cells. For example, a voltage of the channel may be above a threshold voltage as word lines are driven to the pass voltage, which may induce leakage in unselected memory cells (e.g., memory cells adjacent to a selected memory cell). To mitigate memory cell leakage, the memory system may introduce a delay between boosting a voltage of the channel and driving one or more word lines in a read operation, such that the voltage of the channel may discharge below the threshold voltage prior to reading the selected memory cell. However, the delay may be unnecessary or disadvantageous if the channel is boosted from a state different from a stable state (e.g., a transient state) because the voltage of the channel may already be below the threshold voltage prior to the delay. Accordingly, including a delay in every read operation may reduce efficiency, and, more generally, may reduce the overall performance of the memory system.

In accordance with examples as disclosed herein, a memory system may implement a read operation including a delay (e.g., a first type of read operation) if a channel is at the stable state, and may implement a read operation without the delay (e.g., a second type of read operation) if the channel is in a transient state (e.g., at a negative potential). For example, upon receiving a read command for one or more memory cells associated with a channel, the memory system may determine whether the channel is in a stable state or a transient state based on the amount of time elapsed (e.g., based on a timed duration) since the last access operation performed on the set of memory cells. If the channel is in the stable state, the memory system may perform a read operation by including a delay between boosting the channel and driving respective word lines, such that the channel may at least partially discharge (e.g., below a threshold voltage) prior to driving the word lines. By allowing the channel to at least partially discharge, the memory system may mitigate charge leakage from one or more unselected memory cells to the channel during the read operation (e.g., due to a difference in voltage between unselected memory cells and the channel). If the channel is in the transient state, the memory system may perform a read operation with a reduced delay (or with no delay) between boosting the channel and driving the word lines, as the channel may already be below the threshold voltage.

Accordingly, the memory system may perform efficient read operations without inducing charge leakage in one or more memory cells, thereby improving its overall performance.

Features of the disclosure are initially described in the context of systems, devices, and circuits with reference to FIG. 1. Features of the disclosure are described in the context of a memory array, a timing diagram, and a process flow diagram with reference to FIGS. 2 through 4. These and other features of the disclosure are further illustrated by and described in the context of an apparatus diagram and flowchart that relate to transient and stable state read operations of a memory device with reference to FIGS. 5 and 6.

FIG. 1 illustrates an example of a system 100 that supports transient and stable state read operations of a memory device in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support transient and stable state read operations of a memory device. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

A memory system 110 may include a set of memory cells (e.g., a block 170, a portion of a block 170) sharing a channel. In some examples, the memory system 110 may receive a command from a host system 105 to perform a read operation on a memory cell of the set of memory cells. During the read operation, one or more word lines of other memory cells of the set may be driven to a voltage level (e.g., a pass voltage level) to read a logic state of the memory cell. A voltage of the channel may be boosted (e.g., raised by coupling from the word lines) by driving the word lines to the voltage level. The read operation may result in a residual charge (e.g., a negative potential) at the channel, which may discharge (e.g., discharge to a stable state value, to a ground reference) over a duration following the read operation. Subsequent read operations may boost (e.g., re-boost) the voltage of the channel from the stable state value to a respective voltage level that is based on a duration since a previous read operation to the set of memory cells.

In some examples, performing an access operation with the voltage of the channel boosted from the stable state may adversely affect the set of memory cells. For example, a voltage of the channel may be above a threshold voltage as word lines are driven to the pass voltage, which may induce leakage in unselected memory cells (e.g., adjacent to a selected memory cell). To mitigate memory cell leakage, the memory system 110 may introduce a delay between boosting a voltage of the channel and driving one or more word lines, such that the voltage of the channel may at least partially discharge (e.g., below the threshold voltage) prior to reading the selected memory cell.

In accordance with examples as disclosed herein, a memory system 110 may implement a read operation including a delay (e.g., a first type of read operation) if a channel is at the stable state, and may implement a read operation without the delay (e.g., a second type of read operation) if the channel is in a transient state (e.g., at a negative potential). For example, upon receiving a command to read one or more of a set of memory cells sharing the channel from the host system 105, the memory system 110 may determine whether the channel is in a stable state or a transient state based on the amount of time elapsed (e.g., based on a timed duration) since the last access operation performed on the set of memory cells. If the channel is in the stable state, the memory system 110 may perform a read operation including a delay between boosting the channel and driving respective word lines, such that the channel may at least partially discharge (e.g., below a threshold voltage) prior to driving the word lines. By allowing the channel to at least partially discharge, the memory system 110 may mitigate charge leakage from one or more unselected memory cells to the channel during the read operation (e.g., due to a difference in voltage between unselected memory cells and the channel). If the channel is in the transient state, the memory system 110 may perform a read operation with a reduced delay between boosting the channel and driving the word lines, as the channel may already be below the threshold voltage. Accordingly, the memory system 110 may perform efficient read operations without inducing charge leakage in one or more memory cells, thereby improving overall performance.

Figure 2:
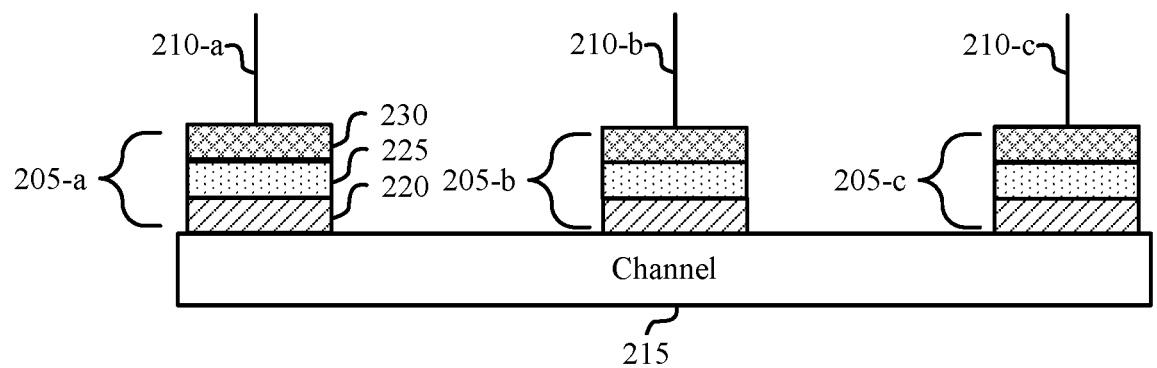
FIG. 2 illustrates an example of a memory array that supports transient and stable state read operations of a memory device in accordance with examples as disclosed herein.
Figure 2:
Figure 2:
Figure 2:
Figure 2:

FIG. 2 illustrates an example of a memory array 200 that supports transient and stable state read operations of a memory device in accordance with examples as disclosed herein. The memory array 200 may be an example of a block 170 or a portion of a block 170 as described with reference to FIG. 1, and may include memory cells 205, word lines 210, and a channel 215. Although illustrated as including three memory cells 205, the memory array 200 may include fewer or more memory cells 205 (e.g., tens of memory cells 205, hundreds of memory cells 205). A memory system including the memory array 200 may support read operations performed on the memory cells 205 (e.g., in accordance with one or more read commands) as described herein. For example, the memory system may perform efficient read operations without inducing charge leakage in one or more memory cells, thereby improving its overall performance.

In some examples, each of the memory cells 205 may include a first dielectric material 220, a storage element 225, and a second dielectric material 230 (e.g., as described with reference to FIG. 1). In some examples, the storage element 225 may be a floating gate. Each of the memory cells 205 may be coupled with a respective word line 210 (e.g., the word line 210 may be a control gate of the memory cell 205 separated from the storage element 225 by a second dielectric material 230), and the memory cells 205 may be coupled with the channel 215 (e.g., at a first dielectric material 220). In such examples, the memory cells 205 may include additional layers (e.g., one or more layers of an oxide material, one or more layers of a conductive material), interposed between various components of the memory cells 205 (not shown). The memory system may receive a command to read a logic state from the memory cells 205.

In a corresponding read operation, the memory system may drive word lines 210 (e.g., to a relatively high voltage), where driving the word lines 210 may boost the channel 215 (e.g., temporarily increasing the voltage of the channel 215 over a duration) due to a capacitive coupling between the word lines 210 and the channel 215. In such examples, the memory system may then drive word lines 210 to a relatively lower voltage (e.g., a reference ground), and the channel 215 may accumulate a residual charge (e.g., a negative potential) due to the capacitive coupling. The residual charge may gradually dissipate (e.g., discharge) from the channel 215 (e.g., over a duration following the read operation) to a stable state (e.g., the channel 215 may discharge to a ground voltage).

In some examples in which the channel 215 is in a transient state, the memory system may receive a command to read a logic state from a memory cell 205-*b*, and may perform a corresponding read operation without including a delay. To read the memory cell 205-*b*, the memory system may drive the word lines 210-*a* and 210-*c* (e.g., corresponding to unselected memory cells 205-*a* and 205-*c*) to a first voltage level and may drive the word line 210-*b* (e.g., corresponding to selected memory cell 205-*b*) to a second voltage level (e.g., concurrently, at a same time as driving the word lines 210-*a* and 210-*c*). Driving the word lines 210 may boost the channel 215, where the channel 215 may be boosted to a lower voltage level because the channel 215 included a negative potential (e.g., corresponding to the transient state) prior to the read operation. A charge (or lack thereof) stored at the memory cell 205-*b* may then be sensed to determine the logic state of the memory cell 205-*b* by driving the voltage level of the word line 210-*b* to a voltage (e.g., a third voltage level less than the second voltage level) to sense the charge on the storage element 225. Following the read operation, the word lines 210-*a* and 210-*b* may be driven to a relatively lower voltage (e.g., a ground voltage). By driving the word lines 210 to a lower voltage, a negative potential may accumulate on the channel 215, corresponding to a transient state.

After the read operation, the channel 215 may remain in the transient state. A channel 215 may be in a transient state when it includes a residual charge (e.g., a negative potential) due to the capacitive coupling between word lines 210 and the channel 215, which may dissipate (e.g., discharge) over a duration following the read operation. For example, the channel 215 may discharge from a negative potential to a ground voltage over the duration. In some cases, the channel 215 may discharge to a node (e.g., a sink; not shown). Following the duration, the channel 215 may be in a stable state, where the channel 215 may be fully discharged (e.g., to a ground voltage; to 0V).

In such examples, the memory system may perform subsequent read operations on one or more memory cells 205 where the channel 215 is boosted to different voltage levels in accordance with a voltage condition of the channel 215 (e.g., a stable state, a transient state). For example, the voltage level of the channel 215 may be boosted to a relatively higher voltage when the channel is in the stable state. Accordingly, the memory system may selectively introduce a delay between driving word lines 210 to a relatively higher voltage (e.g., associated with boosting the channel 215) and driving selected word lines 210 (e.g., corresponding to a selected memory cell 205) to the third voltage level if the channel 215 is in a stable state such that the channel 215 may at least partially discharge (e.g., below a threshold voltage) prior to driving selected word lines 210 to prevent charge leakage (e.g., from the memory cells 205) due to a voltage difference between unselected memory cells 205 and the channel 215. Conversely, the memory system may not include a delay if the channel 215 is in a transient state as the channel 215 may already be below the threshold voltage (e.g., prior to driving word lines 210). Accordingly, the memory system may perform more efficient read operations while mitigating the chance of charge leakage. For example, the memory system may perform efficient read operations without inducing charge leakage in one or more memory cells, thereby improving its overall performance.

Figure 3:
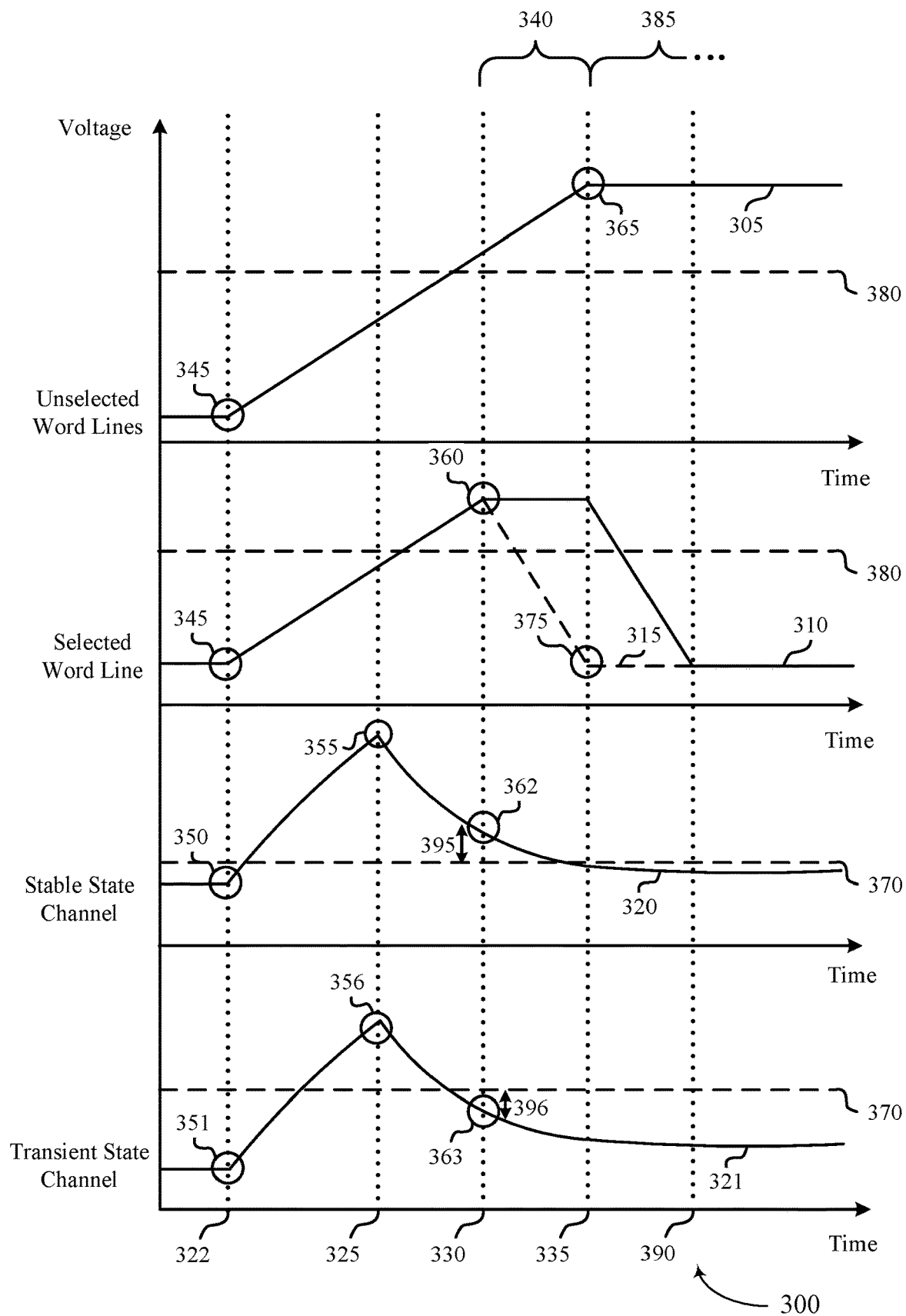
FIG. 3 illustrates an example of a timing diagram that supports transient and stable state read operations of a memory device in accordance with examples as disclosed herein.

FIG. 3 illustrates an example of a timing diagram 300 that supports transient and stable state read operations of a memory device in accordance with examples as disclosed herein. The timing diagram 300 may illustrate voltages of various components of a memory system during a read operation. For example, the timing diagram 300 may illustrate a waveform 305 of unselected word lines, a waveform 310 of a selected word line, a waveform 320 of a channel initially in a stable state, and a waveform 321 of a channel initially in a transient state during a read operation. The selected word line and the unselected word line may be examples of the word lines 210 as described with reference to FIG. 2, where the selected word line may be coupled with a memory cell of a set of memory cells and the unselected word lines may be coupled with one or more unselected memory cells of the set of memory cells. The channel may be an example of the channel 215 as described with reference to FIG. 2.

In some examples, at a time 322, the memory system may begin a read operation. Prior to the read operation, the waveforms 305 and 310 may be at a reference voltage (e.g., ground). If the channel is in a stable state prior to the read operation, the voltage of the channel may be represented by the waveform 320. Alternatively, if the channel is in a transient state prior to the read operation, the voltage of the channel may be represented by the waveform 321. In some cases, the memory system may perform a read operation based on receiving a read command from a host device. At the time 322, the waveform 305 and the waveform 310 may be at a voltage value 345 (e.g., at a ground voltage level, a first voltage, a fourth voltage), waveform 320 may be at a voltage value 350, and the waveform 321 may be at a voltage value 351. The voltage value 350 may be at a reference voltage (e.g., ground), and the voltage value 351 may be less than the voltage value 350 (e.g., less than ground).

For example, the voltage value 351 may be relatively lower (e.g., a more negative potential) than the voltage value 350 as the channel may include a residual charge (e.g., due to a prior read operation) when in a transient state. Additionally or alternatively, at the time 322, the memory system may determine the voltage condition of the channel (e.g., based on a type of read command received, based on a duration since one or more previous read operations to the set of memory cells). In some examples, if the channel is in a stable state (e.g., if the channel is associated with a first voltage condition), the memory system may perform a first type of read operation by introducing a delay before reading one or more memory cells. In other examples, if the channel is in a transient state (e.g., if the channel is associated with a second voltage condition), the memory system may perform a second type of read operation without introducing a delay before reading one or more memory cells. The waveform 320 may represent the channel during the first type of read operation (e.g., associated with a stable state), and the waveform 321 may represent the channel during the second type of read operation (e.g., associated with a transient state).

In such examples, at the time 322, the memory system may begin to drive the waveform 310 and the waveform 305 from the voltage value 345 to a voltage value 360 (e.g., a second voltage, a fifth voltage) and a voltage value 365 (e.g., a second voltage, a fifth voltage), respectively, where the voltage value 360 and the voltage value 365 may have the same or different magnitudes. In some cases, the waveform 310 may increase at a different rate than the waveform 305. Driving word lines (e.g., unselected and/or selected word lines) may boost the channel due to capacitive coupling between the word lines and the channel. Accordingly, during the first type of read operation, the waveform 320 may increase from the voltage value 350 to a voltage value 355. During the second type of read operation, the waveform 321 may increase from the voltage value 351 to a voltage value 356. The voltage value 356 may be less than the voltage value 351.

In some examples, at a time 325, the waveform 320 may reach the voltage value 355 (e.g., a peak voltage level), and the waveform 321 may reach the voltage value 356. For example, the voltage value 355 may be relatively higher than the voltage value 356 as the channel was in a stable state at the time 322. At the time 325, the channel may begin to discharge, and the waveforms 320 and 321 may decrease to the voltage value 350 (e.g., decrease to a lower voltage, to a reference ground). Additionally or alternatively, the unselected word lines and the selected word line may continue to be driven and, as such, the waveform 305 and the waveform 310 may continue to increase (e.g., to the voltage value 365, to the voltage value 360).

In some examples, at a time 330, the waveform 310 may reach the voltage value 360. If, at the time 322, the memory system determines (or, in some examples, determined previously) that the channel is in a stable state condition, the memory system may include a delay over a duration 340 (e.g., between the time 330 and a time 335) before reading the selected memory cell (e.g., corresponding to the selected word line), and the waveform 320 may represent the voltage of the channel during the first read operation. In such examples, the waveform 320 may be at a voltage value 362, where the voltage value 362 may be a magnitude 395 above the voltage threshold 370. In some cases, The waveform 310 may be maintained at the voltage value 360 by floating the selected word line over the duration 340, and the channel may continue to discharge (e.g., partially discharge) to below the voltage threshold 370.

In such examples, at the time 335 and in accordance with the first type of read operation, the memory system may then read the selected memory cell (e.g., after the duration 340). To read the selected memory cell, the memory system may drive the waveform 310 to a voltage value 375 (e.g., the voltage value 345, a third voltage), and the memory system may determine a logic state stored in the selected memory cell (e.g., based on a conductance of the channel). The waveform 305 may be maintained at the voltage value 365 (e.g., above a pass voltage 380) for a duration 385 to prevent charge leakage in unselected memory cells.

In other examples if, at the time 322, the memory system determined that the channel is in the transient state, the memory system may read the selected memory cell at the time 330 in accordance with the second type of read operation, where the memory system may not include a delay over the duration 340 or include an otherwise reduced delay over a second duration (e.g., shorter duration) between the time 330 and reading the selected memory cell. The waveform 321 may represent the voltage of the channel during the second read operation. In such examples, the waveform 321 may be at a voltage value 363. The voltage value 363 may be less than the threshold 370 by a magnitude 396. A waveform 315 may represent the waveform of the selected word line between the time 330 and a time 390 when the memory system is performing the second type of read operation. To read the selected memory cell, the memory system may drive the waveform 315 to the voltage value 375 (e.g., a sixth voltage) at the time 330, while maintaining the waveform 305 above the pass voltage 380. The memory system may then sense the logic state stored at the selected memory cell.

In some cases, after performing either the first type of read operation or the second type of read operation, the memory system may store or otherwise update an indication (e.g., a timestamp) that a read operation was performed on the set of memory cells. In such cases, the memory system may determine a voltage condition of the channel based on a quantity or characteristic of stored indications, in which, for example, the memory system may determine the voltage condition based on a quantity of indications stored within a duration (e.g., a third duration, a fourth duration) prior to a next read operation.

By implementing either a first or a second type of read operation depending on a voltage condition of the channel, the memory system may perform more efficient read operations while still mitigating the risk of charge leakage due to sequential reads inducing the hot electron effect on one or more memory cells. For example, the memory system may perform the first type of read operation (e.g., including a delay) if the channel is in a stable state to ensure the channel voltage is below a threshold such that one or more unselected memory cells do not experience charge leakage, and may perform the second, quicker type of read operation if the channel is in a transient state. Accordingly, the memory system may perform more efficient read operations while mitigating the chance of charge leakage. For example, the memory system may perform efficient read operations without inducing charge leakage in one or more memory cells, thereby improving its overall performance.

Figure 4:
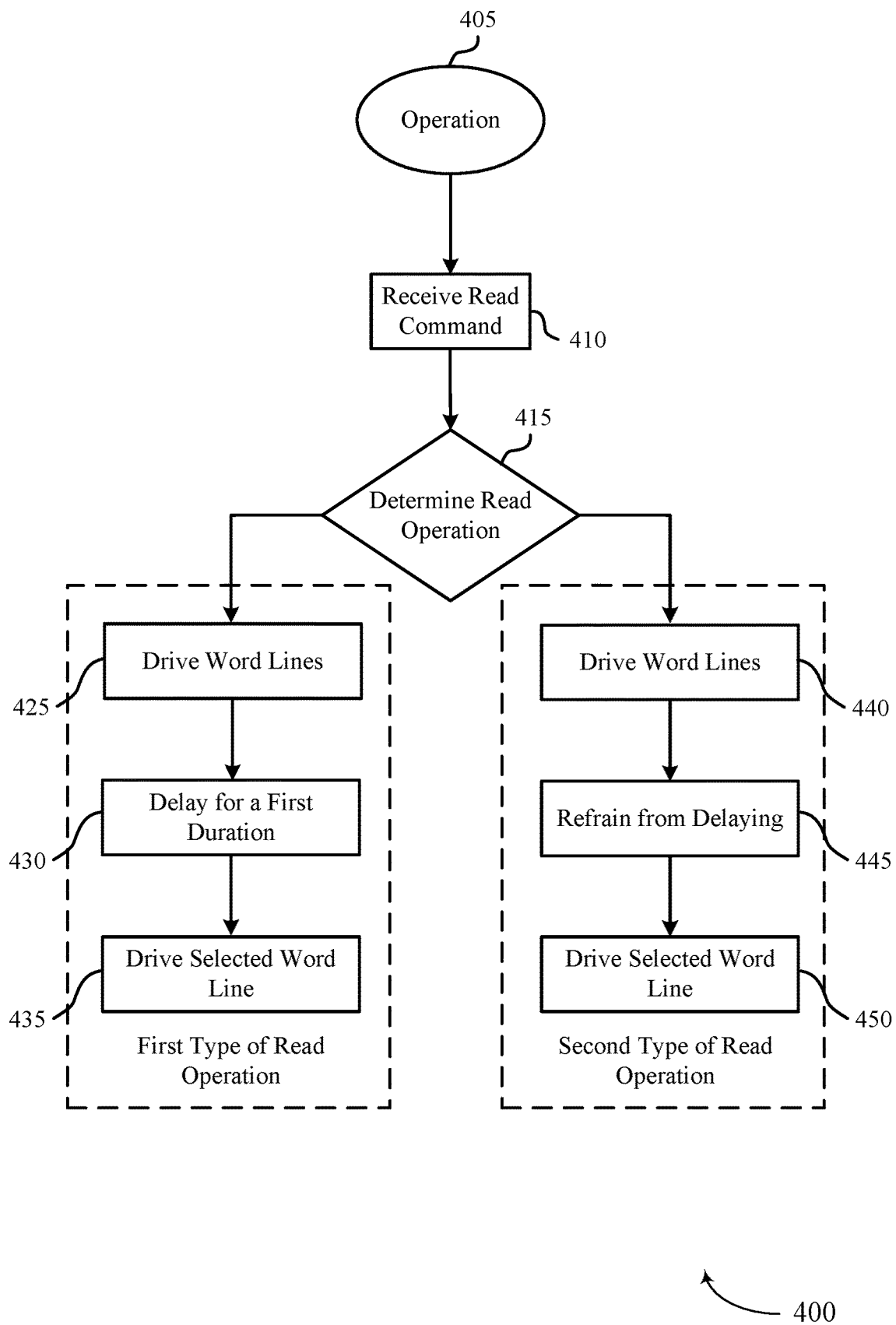
FIG. 4 illustrates an example of a process flow diagram that supports transient and stable state read operations of a memory device in accordance with examples as disclosed herein.

FIG. 4 illustrates an example of a process flow diagram 400 that supports transient and stable state read operations of a memory device in accordance with examples as disclosed herein. The process flow diagram may be implemented by a memory system as described with reference to FIGS. 1 through 3. The memory system may be an example of the memory system 110 as described with reference to FIG. 1, which may include one or more sets of memory cells as described with reference to FIG. 2. The process flow diagram 400 may depict a process for performing either a first or a second type of read operation, and may be implemented to perform more efficient read operations with reduced risk of charge leakage.

In some cases, one or more aspects of the process flow diagram 400 may be implemented by a controller (e.g., among other components), of the memory system. Additionally or alternatively, aspects of the process flow diagram 400 may be implemented as instructions stored in the memory system, or by circuitry of the memory system. For example, the instructions, if executed by a controller, may cause the memory device to perform one or more of the operations of the process flow diagram 400. Alternative examples of the process flow diagram 400 may be implemented in which some operations are performed in a different order than described, or not performed at all. In some cases, operations may include features not mentioned below, or additional operations may be added.

At 405, the memory system may perform one or more operations, and may be referred to as being in a standby mode with respect to receiving read commands, or other commands, from a host system. In such examples, the memory system may operate in the standby mode until the memory device receives a read command.

At 410, the memory system may receive a read command from the host system. For example, the memory system may receive a command to read one or more memory cells of a set of memory cells. In some cases, upon receiving the read command, the memory system may perform a first type of read operation or a second type of read operation as described herein. Additionally or alternatively, the memory system may receive a plurality of read commands (e.g., associated with the same or one or more different sets of memory cells) and perform read operations in accordance with each of the plurality of read commands.

At 415, the memory system may determine whether to perform the first type of read operation or the second type of read operation. In some examples, the memory system may determine whether to perform the first type of read operation or the second type of read operation in accordance with a relative position of a read operation within a sequence of the read operations. For example, if the memory system receives a plurality of read commands to the set of memory cells, the memory system may perform a first read operation (e.g., associated with a first read command of the plurality of read commands) using the first type of read operation, and the memory system may perform subsequent read operations (e.g., associated with the remaining read commands of the of the plurality of read commands) using the second type of read operation. Because the read operations are performed in sequence, the channel may be in a stable state prior to the first read operation and in a transient state prior to each subsequent operation (e.g. performed consecutively).

In further examples, the memory system may determine whether to perform the first type of read operation or the second type of read operation based on an amount of time elapsed (e.g., based on a duration) since the last access operation performed on the set of memory cells. For example, the memory system may determine an elapsed time since a previous access operation by comparing the current time with a respective time (e.g., timestamp) stored in the memory system. If the elapsed time satisfies (e.g., exceeds) a threshold duration, the channel shared by the set of memory cells may be in a stable state, and the memory system may perform the first type of read operations. If the elapsed time does not satisfy the threshold duration, the channel may be in a transient state, and the memory system may perform the second type of read operation. Additionally or alternatively, the memory system may determine a quantity of read operations (e.g., associated with one or more stored indications) performed on the set of memory cells performed in a duration (e.g., a third duration, a fourth duration) prior to receiving the read command at 410. If the quantity of read operations does not satisfy a threshold quantity of read operations, the memory system may determine that the channel shared by the set of memory cells is in a stable state and may perform the first type of read operation. Conversely, if the quantity of read operations does satisfy the threshold quantity of read operations, the memory system may determine that the channel is in a transient state and may perform the second type of read operation.

If, at 415, the memory system determines to perform the first type of read operation, the memory system may perform the steps described at 425, 430 and 435 to read one or more memory cells (e.g., selected memory cells) of a set of memory cells in accordance with the first type of read operation (e.g., as described with reference to FIG. 4). The first type of read operation may be implemented when the channel is in a stable state, and may include a delay between boosting the channel and driving one or more word lines such that the channel may discharge below a voltage threshold to mitigate the risk of charge leakage (e.g., due to a voltage difference between the channel and one or more unselected memory cells).

At 425, the memory system may drive respective word lines, corresponding to each memory cell of the set of memory cells, from a first voltage (e.g., ground reference voltage) to a second voltage (e.g., above a pass voltage). The memory system may drive unselected word lines (e.g., corresponding to unselected memory cells) at a first rate and a selected word line (e.g., corresponding to a selected memory cell) at a second rate, greater (e.g., faster) than the first rate. In such examples, driving the word lines may boost the channel shared by the set of memory cells to a relatively higher voltage due to the capacitive coupling between the word lines and the channel. As the channel was in a stable state (e.g., prior to performing the first type of read operation), the channel may be boosted to a higher voltage than if the channel was in a transient state.

At 430, the memory system may include a delay over a first duration. In some cases, the first duration may depend on an elapsed time since a previous read operation. For example, the first duration may be indirectly proportional to the elapsed time between a previous read operation and the current operation. The memory system may determine the elapsed time based on a comparison between a timestamp associated with the previous read operation and the current time. Over the first duration, the memory system may float the selected word line at the second voltage. Additionally or alternatively, the memory system may maintain the unselected word lines above a pass voltage for at least the first duration. A voltage of the channel may discharge (e.g., fully discharge, partially discharge) over the first duration (e.g., to under a threshold voltage). In such examples, by including the delay, the memory system may reduce charge leakage from one or more memory cells adjacent to the selected memory cell due to repeated access operations performed when the channel is in a stable state.

At 435, the memory system may drive the selected word line from the second voltage to a third voltage to read the selected memory cell, where the third voltage may be the same as the first voltage. The unselected word lines may be maintained at the second voltage, and the voltage of the channel may be less than the threshold voltage. The memory system may read the selected memory cell (e.g., based on a conductance of the channel).

If, at 415, the memory system determines to perform the second type of read operation, the memory system perform the steps described at 440, 445, and 450 to read one or more memory cells (e.g., selected memory cells) in accordance with the second type of read operation (e.g., as described with reference to FIG. 3). The second type of read operation may be implemented when the channel is in a transient state, and may not include a delay between boosting the channel and driving one or more word lines as the channel is already less than the voltage threshold. Accordingly, the second type of read operation may be more efficient than the first type of read operation.

At 440, the memory system may drive respective word lines corresponding to each memory cell of the set of memory cells from the first voltage to the second voltage. The memory system may drive unselected word lines (e.g., corresponding to unselected memory cells) at a first rate and selected word lines (e.g., corresponding to selected memory cells) at a second rate, greater (e.g., faster) than the first rate.

In such examples, driving the word lines may boost a channel shared by the set of memory cells to a relatively higher voltage due to conductive coupling between the word lines and the channel. As the channel was in a transient state (e.g., prior to performing the second type of read operation), the channel may be boosted to a lower voltage than if the channel was in a transient state.

At 445, the memory system may refrain from including a delay in the read operation. For example, the memory system may maintain the selected word line at the second voltage level for a second duration less than the first duration by floating the selected word line. Alternatively, the memory system may not float the selected word line. In some cases, the memory system may maintain the unselected word lines at the second voltage for at least the second duration. A voltage of the channel may be below the threshold voltage at 445 and, as such, the memory system may not include the delay because adjacent unselected memory cells may not be at risk of charge leakage (e.g., due to a voltage difference between the channel and unselected memory cells, due to repeated reads at a stable channel state).

At 450, the memory system may drive the selected word line from the second voltage to a third voltage to read the selected memory cell, where the third voltage may be the same as the first voltage. The unselected word lines may continue to float, and the voltage of the channel may be less than the threshold voltage. The memory system may then read the selected memory cell (e.g., based on a conductance of the channel). The second type of read operation may be quicker than the first type of read operation as it does not include a delay.

In such examples (e.g., after performing the first type of read operation, after performing the second type of read operation), the memory system may store or otherwise update an indication that one or more accesses (e.g., one or more read operations) to the set of memory cells were performed. For example, the memory system may store a timestamp indicating a respective time at which the read operation occurred. Subsequently, the memory system may return to 405. Additionally or alternatively, the memory system may return to 415 and perform additional read operations (e.g., in accordance with one or more additional read commands received at 410). Accordingly, the memory system may perform more efficient read operations while mitigating the chance of charge leakage. For example, the memory system may perform efficient read operations without inducing charge leakage in one or more memory cells, thereby improving its overall performance.

Figure 5:
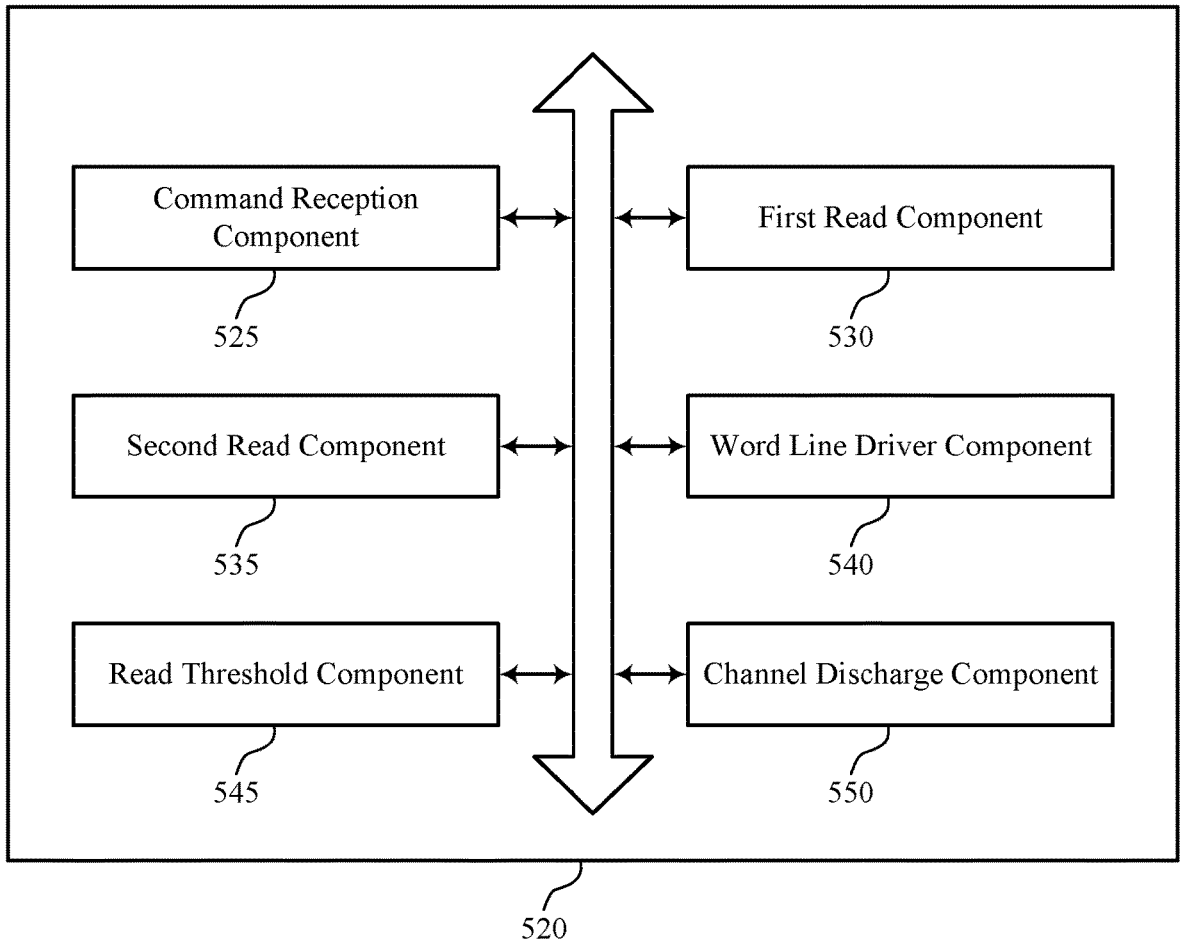
FIG. 5 shows a block diagram of a memory system that supports transient and stable state read operations of a memory device in accordance with examples as disclosed herein.

FIG. 5 shows a block diagram 500 of a memory system 520 that supports transient and stable state read operations of a memory device in accordance with examples as disclosed herein. The memory system 520 may be an example of aspects of a memory system as described with reference to FIGS. 1 through 4. The memory system 520, or various components thereof, may be an example of means for performing various aspects of transient and stable state read operations of a memory device as described herein. For example, the memory system 520 may include a command reception component 525, a first read component 530, a second read component 535, a word line driver component 540, a read threshold component 545, a channel discharge component 550, or any combination thereof. Each of these components may communicate, directly or indirectly, with one another (e.g., via one or more buses).

The command reception component 525 may be configured as or otherwise support a means for receiving, at a memory system, a first read command associated with a first memory cell of a first set of memory cells, where the first set of memory cells includes a first channel. The first read component 530 may be configured as or otherwise support a means for reading the first memory cell using a first type of read operation based at least in part on determining that the first channel includes a first voltage condition, where the first type of read operation includes including a delay associated with discharging at least a portion of a charge on the first channel over a first duration. In some examples, the command reception component 525 may be configured as or otherwise support a means for receiving a second read command associated with a second memory cell of a second set of memory cells, where the second set of memory cells includes a second channel. The second read component 535 may be configured as or otherwise support a means for reading the second memory cell using a second type of read operation based at least in part on determining that the second channel includes a second voltage condition, where the second type of read operation includes refraining from including the delay.

In some examples, to support reading the first memory cell using the first type of read operation, the word line driver component 540 may be configured as or otherwise support a means for driving respective word lines associated with the first set of memory cells from a first voltage to a second voltage at a first time. In some examples, to support reading the first memory cell using the first type of read operation, the word line driver component 540 may be configured as or otherwise support a means for maintaining, for the first duration after the first time, a word line coupled with the first memory cell at the second voltage based at least in part on determining that the first channel includes the first voltage condition.

In some examples, to support reading the first memory cell using the first type of read operation, the word line driver component 540 may be configured as or otherwise support a means for driving, after the first duration, the word line coupled with the first memory cell from the second voltage to a third voltage.

In some examples, to support maintaining the word line coupled with the first memory cell at the second voltage, the word line driver component 540 may be configured as or otherwise support a means for floating, during the first duration, the word line coupled with the first memory cell.

In some examples, to support reading the second memory cell using the second type of read operation, the word line driver component 540 may be configured as or otherwise support a means for driving respective word lines associated with the second set of memory cells from a fourth voltage to a fifth voltage at a second time. In some examples, to support reading the second memory cell using the second type of read operation, the word line driver component 540 may be configured as or otherwise support a means for maintaining, for a second duration after the second time, a word line coupled with the second memory cell at the fifth voltage based at least in part on determining that the second channel includes the second voltage condition, where the second duration is less than the first duration.

In some examples, to support reading the second memory cell using the second type of read operation, the word line driver component 540 may be configured as or otherwise support a means for driving, after the second duration, the word line coupled with the second memory cell from the fifth voltage to a sixth voltage.

In some examples, the first read command includes a first type of read command associated with the including the delay and the second read command includes a second type of read command associated with refraining to include the delay.

In some examples, to support determining that the first channel includes the first voltage condition, the read threshold component 545 may be configured as or otherwise support a means for determining that a quantity of reads performed on the first set of memory cells within a third duration does not satisfy a threshold.

In some examples, to support determining that the second channel includes the second voltage condition, the read threshold component 545 may be configured as or otherwise support a means for determining that a quantity of reads performed on the second set of memory cells within a fourth duration satisfies a threshold.

In some examples, to support determining that the quantity of reads performed on the second set of memory cells within the fourth duration satisfies the threshold, the read threshold component 545 may be configured as or otherwise support a means for storing respective times of previous accesses of a plurality of sets of memory cells, the plurality of sets of memory cells including the second set of memory cells.

In some examples, to support determining that the second channel includes the second voltage condition, the second read component 535 may be configured as or otherwise support a means for determining that the second read command is from a plurality of read commands issued to the second set of memory cells.

In some examples, to support reading the first memory cell using the first type of read operation, the channel discharge component 550 may be configured as or otherwise support a means for discharging the first channel to below a threshold voltage prior to reading the first memory cell based at least in part on determining that the first channel includes the first voltage condition.

Figure 6:
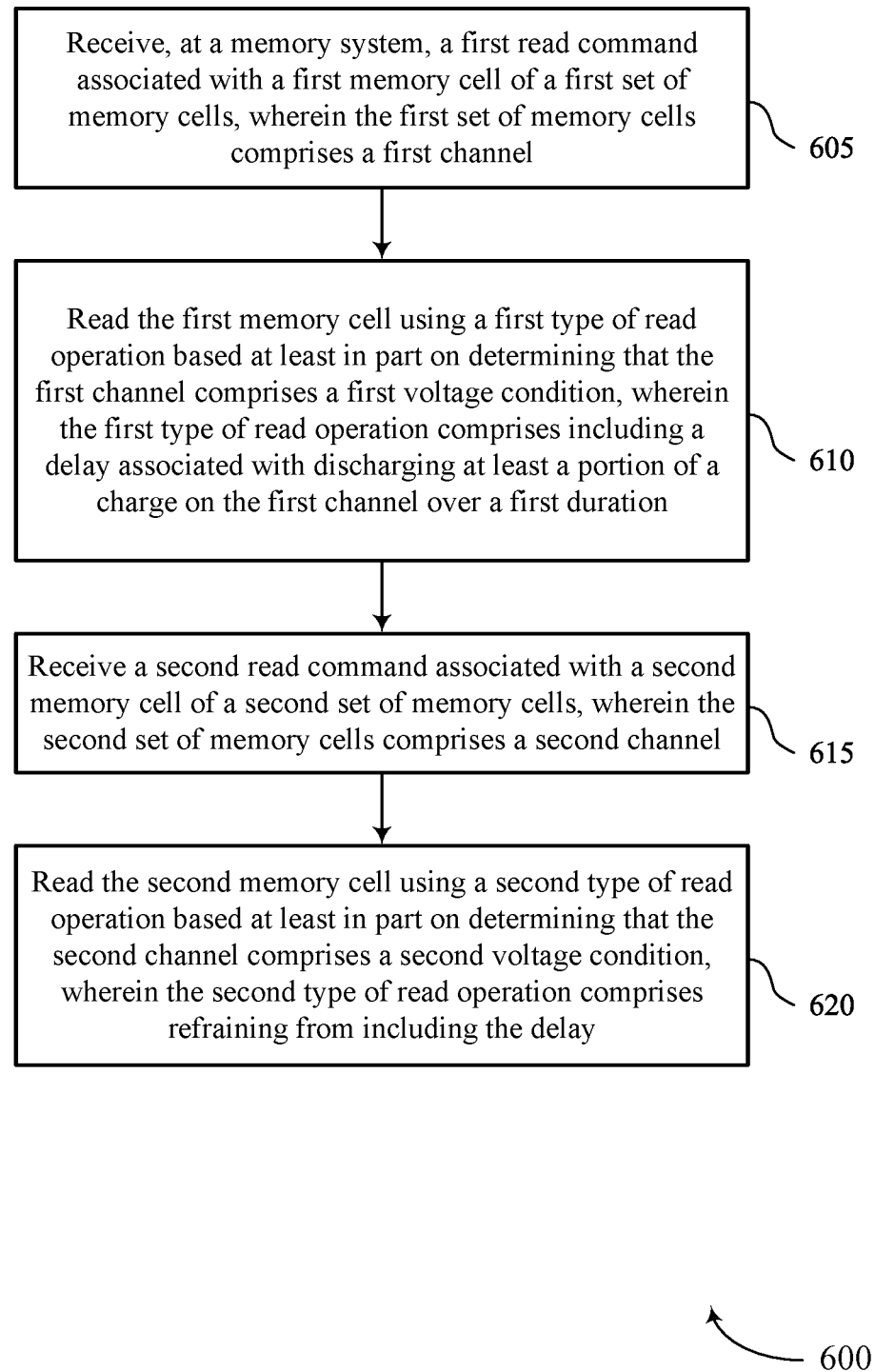
FIG. 6 shows a flowchart illustrating a method or methods that support transient and stable state read operations of a memory device in accordance with examples as disclosed herein.

FIG. 6 shows a flowchart illustrating a method 600 that supports transient and stable state read operations of a memory device in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include receiving, at a memory system, a first read command associated with a first memory cell of a first set of memory cells, where the first set of memory cells includes a first channel. The operations of 605 may be performed in accordance with examples as disclosed herein. In some examples, aspects of the operations of 605 may be performed by a command reception component 525 as described with reference to FIG. 5.

At 610, the method may include reading the first memory cell using a first type of read operation based at least in part on determining that the first channel includes a first voltage condition, where the first type of read operation includes including a delay associated with discharging at least a portion of a charge on the first channel over a first duration. The operations of 610 may be performed in accordance with examples as disclosed herein. In some examples, aspects of the operations of 610 may be performed by a first read component 530 as described with reference to FIG. 5.

At 615, the method may include receiving a second read command associated with a second memory cell of a second set of memory cells, where the second set of memory cells includes a second channel. The operations of 615 may be performed in accordance with examples as disclosed herein. In some examples, aspects of the operations of 615 may be performed by a command reception component 525 as described with reference to FIG. 5.

At 620, the method may include reading the second memory cell using a second type of read operation based at least in part on determining that the second channel includes a second voltage condition, where the second type of read operation includes refraining from including the delay. The operations of 620 may be performed in accordance with examples as disclosed herein. In some examples, aspects of the operations of 620 may be performed by a second read component 535 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory system, a first read command associated with a first memory cell of a first set of memory cells, where the first set of memory cells includes a first channel; reading the first memory cell using a first type of read operation based at least in part on determining that the first channel includes a first voltage condition, where the first type of read operation includes including a delay associated with discharging at least a portion of a charge on the first channel over a first duration; receiving a second read command associated with a second memory cell of a second set of memory cells, where the second set of memory cells includes a second channel; and reading the second memory cell using a second type of read operation based at least in part on determining that the second channel includes a second voltage condition, where the second type of read operation includes refraining from including the delay.

Aspect 2: The method, apparatus, or non-transitory computer-readable medium of aspect 1, where reading the first memory cell using the first type of read operation further includes operations, features, circuitry, logic, means, or instructions, or any combination thereof for driving respective word lines associated with the first set of memory cells from a first voltage to a second voltage at a first time and maintaining, for the first duration after the first time, a word line coupled with the first memory cell at the second voltage based at least in part on determining that the first channel includes the first voltage condition.

Aspect 3: The method, apparatus, or non-transitory computer-readable medium of aspect 2, where reading the first memory cell using the first type of read operation includes operations, features, circuitry, logic, means, or instructions, or any combination thereof for driving, after the first duration, the word line coupled with the first memory cell from the second voltage to a third voltage.

Aspect 4: The method, apparatus, or non-transitory computer-readable medium of any of aspects 2 through 3, where maintaining the word line coupled with the first memory cell at the second voltage includes operations, features, circuitry, logic, means, or instructions, or any combination thereof for floating, during the first duration, the word line coupled with the first memory cell.

Aspect 5: The method, apparatus, or non-transitory computer-readable medium of any of aspects 1 through 4, where reading the second memory cell using the second type of read operation further includes operations, features, circuitry, logic, means, or instructions, or any combination thereof for driving respective word lines associated with the second set of memory cells from a fourth voltage to a fifth voltage at a second time and maintaining, for a second duration after the second time, a word line coupled with the second memory cell at the fifth voltage based at least in part on determining that the second channel includes the second voltage condition, where the second duration is less than the first duration.

Aspect 6: The method, apparatus, or non-transitory computer-readable medium of aspect 5, where reading the second memory cell using the second type of read operation includes operations, features, circuitry, logic, means, or instructions, or any combination thereof for driving, after the second duration, the word line coupled with the second memory cell from the fifth voltage to a sixth voltage.

Aspect 7: The method, apparatus, or non-transitory computer-readable medium of any of aspects 1 through 6, where the first read command includes a first type of read command associated with the including the delay and the second read command includes a second type of read command associated with refraining to include the delay.

Aspect 8: The method, apparatus, or non-transitory computer-readable medium of any of aspects 1 through 7, where determining that the first channel includes the first voltage condition includes operations, features, circuitry, logic, means, or instructions, or any combination thereof for determining that a quantity of reads performed on the first set of memory cells within a third duration does not satisfy a threshold.

Aspect 9: The method, apparatus, or non-transitory computer-readable medium of any of aspects 1 through 8, where determining that the second channel includes the second voltage condition includes operations, features, circuitry, logic, means, or instructions, or any combination thereof for determining that a quantity of reads performed on the second set of memory cells within a fourth duration satisfies a threshold.

Aspect 10: The method, apparatus, or non-transitory computer-readable medium of aspect 9, where determining that the quantity of reads performed on the second set of memory cells within the fourth duration satisfies the threshold includes operations, features, circuitry, logic, means, or instructions, or any combination thereof for storing respective times of previous accesses of a plurality of sets of memory cells, the plurality of sets of memory cells including the second set of memory cells.

Aspect 11: The method, apparatus, or non-transitory computer-readable medium of any of aspects 1 through 10, where determining that the second channel includes the second voltage condition includes operations, features, circuitry, logic, means, or instructions, or any combination thereof for determining that the second read command is from a plurality of read commands issued to the second set of memory cells.

Aspect 12: The method, apparatus, or non-transitory computer-readable medium of any of aspects 1 through 11, where reading the first memory cell using the first type of read operation includes operations, features, circuitry, logic, means, or instructions, or any combination thereof for discharging the first channel to below a threshold voltage prior to reading the first memory cell based at least in part on determining that the first channel includes the first voltage condition.

It should be noted that the described methods include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    receiving, at a memory system, a first read command associated with a first memory cell of a first set of memory cells, wherein the first set of memory cells comprises a first channel;
    reading the first memory cell using a first type of read operation based on determining that the first channel comprises a first voltage condition, wherein the first type of read operation includes a delay associated with discharging at least a portion of a charge on the first channel over a first duration, and wherein the first voltage condition is based at least in part on a duration since a previous read operation performed on the first set of memory cells;
    receiving a second read command associated with a second memory cell of a second set of memory cells, wherein the second set of memory cells comprises a second channel; and
    reading the second memory cell using a second type of read operation based on determining that the second channel comprises a second voltage condition, wherein the second type of read operation refrains from including the delay.

2. The method of claim 1, wherein reading the first memory cell using the first type of read operation further comprises:
    driving respective word lines associated with the first set of memory cells from a first voltage to a second voltage at a first time; and
    maintaining, for the first duration after the first time, a word line coupled with the first memory cell at the second voltage based at least in part on determining that the first channel comprises the first voltage condition.

3. The method of claim 2, wherein reading the first memory cell using the first type of read operation comprises:
    driving, after the first duration, the word line coupled with the first memory cell from the second voltage to a third voltage.

4. The method of claim 2, wherein maintaining the word line coupled with the first memory cell at the second voltage comprises:
    floating, during the first duration, the word line coupled with the first memory cell.

5. The method of claim 1, wherein reading the second memory cell using the second type of read operation further comprises:
    driving respective word lines associated with the second set of memory cells from a fourth voltage to a fifth voltage at a second time; and
    maintaining, for a second duration after the second time, a word line coupled with the second memory cell at the fifth voltage based at least in part on determining that the second channel comprises the second voltage condition, wherein the second duration is less than the first duration.

6. The method of claim 5, wherein reading the second memory cell using the second type of read operation comprises:
    driving, after the second duration, the word line coupled with the second memory cell from the fifth voltage to a sixth voltage.

7. The method of claim 1, wherein the first read command comprises a first type of read command associated with including the delay and the second read command comprises a second type of read command associated with refraining to include the delay.

8. The method of claim 1, wherein determining that the first channel comprises the first voltage condition comprises:
    determining that a quantity of reads performed on the first set of memory cells within a third duration does not satisfy a threshold.

9. The method of claim 1, wherein determining that the second channel comprises the second voltage condition comprises:
    determining that a quantity of reads performed on the second set of memory cells within a fourth duration satisfies a threshold.

10. The method of claim 9, wherein determining that the quantity of reads performed on the second set of memory cells within the fourth duration satisfies the threshold comprises:
    storing respective times of previous accesses of a plurality of sets of memory cells, the plurality of sets of memory cells comprising the second set of memory cells.

11. The method of claim 1, wherein determining that the second channel comprises the second voltage condition comprises:
    determining that the second read command is from a plurality of read commands issued to the second set of memory cells.

12. The method of claim 1, wherein reading the first memory cell using the first type of read operation comprises:
    discharging the first channel to below a threshold voltage prior to reading the first memory cell based at least in part on determining that the first channel comprises the first voltage condition.

13. A memory system, comprising:
    one or more memory devices; and
    one or more controllers coupled with the one or more memory devices and configured to cause the memory system to:
        receive, at the memory system, a first read command associated with a first memory cell of a first set of memory cells, wherein the first set of memory cells comprises a first channel;
        read the first memory cell using a first type of read operation based at least in part on determining that the first channel comprises a first voltage condition, wherein the first type of read operation comprises including a delay associated with discharging at least a portion of a charge on the first channel over a first duration, and wherein the first voltage condition is based at least in part on a duration since a previous read operation performed on the first set of memory cells;

receive a second read command associated with a second memory cell of a second set of memory cells, wherein the second set of memory cells comprises a second channel; and read the second memory cell using a second type of read operation based at least in part on determining that the second channel comprises a second voltage condition, wherein the second type of read operation comprises refraining from including the delay.

14. The memory system of claim 13, wherein reading the first memory cell using the first type of read operation is further configured to cause the memory system to:

drive respective word lines associated with the first set of memory cells from a first voltage to a second voltage at a first time; and maintain, for the first duration after the first time, a word line coupled with the first memory cell at the second voltage based at least in part on determining that the first channel comprises the first voltage condition.

15. The memory system of claim 14, wherein reading the first memory cell using the first type of read operation is configured to cause the memory system to:

drive, after the first duration, the word line coupled with the first memory cell from the second voltage to a third voltage.

16. The memory system of claim 14, wherein maintaining the word line coupled with the first memory cell at the second voltage is configured to cause the memory system to:

float, during the first duration, the word line coupled with the first memory cell.

17. The memory system of claim 13, wherein reading the second memory cell using the second type of read operation is further configured to cause the memory system to:

drive respective word lines associated with the second set of memory cells from a fourth voltage to a fifth voltage at a second time; and maintain, for a second duration after the second time, a word line coupled with the second memory cell at the fifth voltage based at least in part on determining that the second channel comprises the second voltage condition, wherein the second duration is less than the first duration.

18. The memory system of claim 17, wherein reading the second memory cell using the second type of read operation is configured to cause the memory system to:

drive, after the second duration, the word line coupled with the second memory cell from the fifth voltage to a sixth voltage.

19. The memory system of claim 13, wherein the first read command comprises a first type of read command associated with including the delay and the second read command comprises a second type of read command associated with refraining to include the delay.

20. The memory system of claim 13, wherein determining that the first channel comprises the first voltage condition is configured to cause the memory system to:

determine that a quantity of reads performed on the first set of memory cells within a third duration does not satisfy a threshold.

21. The memory system of claim 13, wherein determining that the second channel comprises the second voltage condition is configured to cause the memory system to:

determine that a quantity of reads performed on the second set of memory cells within a fourth duration satisfies a threshold.

22. The memory system of claim 21, wherein determining that the quantity of reads performed on the second set of memory cells within the fourth duration satisfies the threshold is configured to cause the memory system to:

store respective times of previous accesses of a plurality of sets of memory cells, the plurality of sets of memory cells comprising the second set of memory cells.

23. The memory system of claim 13, wherein determining that the second channel comprises the second voltage condition is configured to cause the memory system to:

determine that the second read command is from a plurality of read commands issued to the second set of memory cells.

24. The memory system of claim 13, wherein reading the first memory cell using the first type of read operation is configured to cause the memory system to:

discharge the first channel to below a threshold voltage prior to reading the first memory cell based at least in part on determining that the first channel comprises the first voltage condition.

25. A non-transitory computer-readable medium storing code, the code comprising instructions executable by a processor to:

receive, at a memory system, a first read command associated with a first memory cell of a first set of memory cells, wherein the first set of memory cells comprises a first channel;

read the first memory cell using a first type of read operation based at least in part on determining that the first channel comprises a first voltage condition, wherein the first type of read operation comprises including a delay associated with discharging at least a portion of a charge on the first channel over a first duration, and wherein the first voltage condition is based at least in part on a duration since a previous read operation performed on the first set of memory cells;

receive a second read command associated with a second memory cell of a second set of memory cells, wherein the second set of memory cells comprises a second channel; and read the second memory cell using a second type of read operation based at least in part on determining that the second channel comprises a second voltage condition, wherein the second type of read operation comprises refraining from including the delay.

* * * * *